United States Patent
Harvey et al.

(10) Patent No.: US 7,037,376 B2
(45) Date of Patent: May 2, 2006

(54) BACKFLUSH CHAMBER CLEAN

(75) Inventors: Keith Harvey, Los Gatos, CA (US); Karthik Janakiraman, San Jose, CA (US); Kirby Floyd, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 367 days.

(21) Appl. No.: 10/412,446

(22) Filed: Apr. 11, 2003

(65) Prior Publication Data

US 2004/0200499 A1    Oct. 14, 2004

(51) Int. Cl.
C23C 16/00 (2006.01)
C23C 16/452 (2006.01)
C23C 16/455 (2006.01)
H01L 21/3065 (2006.01)
C25F 1/00 (2006.01)

(52) U.S. Cl. .............. 118/715; 118/723 ER; 118/723 IR; 118/723 ME; 156/345.29; 156/345.33; 156/345.34; 156/345.35; 156/345.36; 134/1.1; 134/22.19; 134/166 R (58) Field of Classification Search .......... 118/715, 118/723 ER, 723 IR, 723 ME; 156/345.29, 156/345.33, 345.34, 345.35, 345.36
See application file for complete search history.

(56) References Cited

U.S. PATENT DOCUMENTS

| 4,138,306 A | 2/1979 | Niwa |
| 4,449,037 A | 5/1984 | Shibamata et al. |
| 4,563,367 A | 1/1986 | Sherman |
| 4,866,346 A | 9/1989 | Gaudreau et al. |
| 4,910,042 A | 3/1990 | Hokynar |
| 4,913,929 A | 4/1990 | Moslehi et al. |
| 4,988,644 A | 1/1991 | Jucha et al. |
| 5,000,113 A | 3/1991 | Wang et al. |
| 5,158,644 A | 10/1992 | Cheung et al. |
| 5,346,579 A | 9/1994 | Cook et al. |
| 5,403,434 A | 4/1995 | Moslehi |
| 5,450,480 A | 9/1995 | Man et al. |
| 5,662,770 A | 9/1997 | Donohoe |
| 5,688,357 A | 11/1997 | Hanawa |
| 5,770,098 A | 6/1998 | Araki et al. |
| 5,772,771 A * | 6/1998 | Li et al. .................. 118/723 I |

(Continued)

FOREIGN PATENT DOCUMENTS

DE    4132559    4/1993

(Continued)

OTHER PUBLICATIONS

Grill, Alfred, "Cold Plasma in Materials Fabrication", IEEE Press, 1994, pp. 109-110, 160-163.

Primary Examiner—Jeffrie R. Lund
(74) Attorney, Agent, or Firm—Townsend and Townsend and Crew (57) ABSTRACT

A processing chamber may be effectively cleaned by a remote plasma flowed through the chamber in a direction opposite to the direction of gas flowed during wafer processing. Specifically, the remotely generated plasma may be introduced directly into the chamber through a processing gas exhaust or other port, and then be exhausted from the chamber by traveling through the gas distribution shower head to the foreline. In one embodiment of the present invention, this reverse flow of remote cleaning plasma is maintained for the duration of the chamber cleaning step. In an alternative embodiment, the direction of flow of the remote cleaning plasma through the chamber is alternated between this reverse flow and a conventional forward flow.

12 Claims, 9 Drawing Sheets

U.S. PATENT DOCUMENTS

| | | | |
|---|---|---|---|
| 5,788,778 A * | 8/1998 | Shang et al. .................... 134/1 |
| 5,792,272 A | 8/1998 | van Os et al. |
| 5,812,403 A | 9/1998 | Fong et al. |
| 5,844,195 A | 12/1998 | Fairbairn et al. |
| 5,942,804 A | 8/1999 | Mohwinkel et al. |
| 6,039,834 A | 3/2000 | Tanaka et al. |
| 6,055,927 A * | 5/2000 | Shang et al. ......... 118/723 ME |
| 6,060,400 A | 5/2000 | Oehrlein et al. |
| 6,063,198 A * | 5/2000 | Bang et al. ................. 118/715 |
| 6,109,206 A | 8/2000 | Maydan et al. |
| 6,125,859 A | 10/2000 | Kao et al. |
| 6,148,832 A | 11/2000 | Gilmer et al. |
| 6,170,428 B1 | 1/2001 | Redeker et al. |
| 6,182,602 B1 | 2/2001 | Redeker et al. |
| 6,217,951 B1 | 4/2001 | Mizuno et al. |
| 6,230,652 B1 * | 5/2001 | Tanaka et al. ....... 118/723 ME |
| 6,326,732 B1 | 12/2001 | Abadeer et al. |
| 6,329,297 B1 * | 12/2001 | Balish et al. ................ 438/714 |
| 6,387,207 B1 * | 5/2002 | Janakiraman et al. .................... 118/723 ME |
| 6,680,420 B1 * | 1/2004 | Pang et al. .................. 118/639 |
| 6,773,687 B1 * | 8/2004 | Hasegawa ................... 423/210 |
| 6,800,139 B1 * | 10/2004 | Shinriki et al. ............. 118/715 |
| 6,807,971 B1 * | 10/2004 | Saito et al. ............... 134/22.11 |
| 6,824,825 B1 * | 11/2004 | Otsuki ................... 427/255.38 |
| 6,884,738 B1 * | 4/2005 | Asai et al. ................... 438/758 |
| 2002/0020429 A1 * | 2/2002 | Selbrede et al. ............. 134/1.1 |
| 2003/0180458 A1 * | 9/2003 | Sneh ....................... 427/248.1 |
| 2004/0083964 A1 * | 5/2004 | Ingle et al. ................. 118/715 |
| 2004/0175944 A1 * | 9/2004 | Kobayashi ................... 438/689 |
| 2004/0182423 A1 * | 9/2004 | Nakao ....................... 134/22.1 |
| 2004/0200499 A1 * | 10/2004 | Harvey et al. ............... 134/1.1 |
| 2004/0250775 A1 * | 12/2004 | Sakai et al. ................. 118/728 |
| 2005/0000434 A1 * | 1/2005 | Lee et al. .................... 118/715 |
| 2005/0120955 A1 * | 6/2005 | Yamasaki et al. ........... 118/715 |

FOREIGN PATENT DOCUMENTS

| | | |
|---|---|---|
| EP | 0537950 | 4/1993 |
| EP | 0552491 | 7/1993 |
| EP | 0697467 | 2/1996 |
| EP | 0578010 B1 | 8/1998 |
| JP | 1-220434 | 9/1989 |
| JP | 2-125876 | 5/1990 |
| WO | WO 97/03223 | 1/1997 |
| WO | WO 99/02754 | 1/1999 |
| WO | WO 99/03312 | 1/1999 |
| WO | WO 01/75932 A2 | 10/2001 |
| WO | WO 02/04691 A2 | 1/2002 |

* cited by examiner

BACKFLUSH CHAMBER CLEAN

BACKGROUND OF THE INVENTION

The fabrication of semiconductor products, such as integrated circuits, often involves the formation of layers on a substrate, such as a silicon wafer. Various techniques have been developed for the deposition processes, as the layers often involve different materials. For example, a metal layer might be deposited and patterned to form conductive interconnects, or a dielectric layer might be formed to electrically insulate one conductive layer from another. Types of layer formation processes that have been used to form layers of dielectric materials and other materials include chemical vapor deposition (CVD) processes.

CVD processes include thermal deposition processes, in which precursor gases or vapors react in response to the heated surface of the substrate, as well as plasma-enhanced CVD ("PECVD") processes, in which electromagnetic energy is applied to at least one precursor gas or vapor to transform the precursor into a more reactive plasma. Forming a plasma can lower the temperature required to form a film, increase the rate of formation, or both. Therefore, plasma-enhanced process are desirable in many applications.

When a layer is formed on a substrate, some material is usually also deposited as residue on exposed surfaces of the deposition chamber, including the chamber walls and gas distribution face plate. This material residue is generally undesirable because it can build up and become a source of particulate contamination, causing wafers to be rejected. Several cleaning procedures have been developed to remove residue from inside the chamber. One type of procedure, known as a "wet-clean" is performed by partially disassembling the deposition chamber and wiping the surfaces down with appropriate cleaning fluids. Other types of cleaning processes utilize a plasma to remove the residue by converting it to a volatile product that can be removed by the chamber exhaust system. These processes are known as "dry" cleans.

There are two general types of plasma dry cleaning processes. One type forms a plasma inside the processing chamber, or "in situ". An example of an in situ plasma clean uses $NF_3$ and $C_2F_6$ gases to form free fluorine for removing residue in the chamber interior.

Another approach to cleaning is to form a plasma in a remote plasma generator and then flow the ions into the processing chamber, typically in the same direction through the same components utilized to flow processing gases into the chamber. Such a remote plasma cleaning process offers several advantages, such as providing a dry clean capability to a deposition system that does not have an in situ plasma system. Furthermore, a remote plasma system may be more efficient at converting cleaning plasma precursor gases or vapors into a plasma, and forming the plasma outside the chamber protects the interior of the chamber from potentially undesirable by-products of the plasma formation process, such as plasma heating and sputtering effects.

There are, however, some less advantageous aspects associated with the utilization of remote plasmas for chamber cleaning. One issue is that the reactive ions in the remotely generated plasma may recombine to form less reactive molecular species as the plasma is transferred from the point of its generation to the processing chamber. Such unwanted recombination reduces the effective concentration of the reactive ions in the chamber, prolonging cleaning times and elevating cost due to the increased consumption of expensive, environmentally-friendly cleaning gases such as $NF_3$.

Typically, the remotely generated plasma experiences a pressure increase as it is flowed through constrictions, as are presented by blocker plate and shower head components responsible for precise distribution of processing gases during deposition or etching. In the context of flowing remotely generated plasmas into the chamber for cleaning, these pressure increases cause unwanted recombination into relatively unreactive molecular species, diluting the effective concentration of reactive ions immediately downstream of the shower head and blocker plate. However, it is the surfaces immediately downstream of the blocker plate and shower head which typically experience the greatest formation of residue and hence require the most cleaning.

Therefore, there is a need in the art for methods and apparatuses which reduce the recombination of ions in a remotely-generated plasma flowed into a processing chamber, thereby maximizing the cleaning effect of the remote plasma.

BRIEF SUMMARY OF THE INVENTION

A processing chamber may be effectively cleaned by a remote plasma flowed through the chamber in a direction opposite to the direction of gas flowed during wafer processing. Specifically, the remotely generated plasma may be introduced directly into the chamber through a processing gas exhaust or other port, and then be exhausted from the chamber by traveling through the gas distribution shower head to the foreline. In one embodiment of the present invention, this reverse flow of remote cleaning plasma is maintained for the duration of the chamber cleaning step. In an alternative embodiment, the direction of flow of the remote cleaning plasma through the chamber is alternated between this reverse flow and a conventional forward flow.

One embodiment of a method in accordance with an embodiment of the present invention for cleaning a substrate processing chamber having a gas distribution showerhead adapted to release one or more processing gases into an interior substrate processing region of the chamber during a substrate processing operation, comprises generating reactive species suitable for removing unwanted material deposits from an interior of the chamber. The reactive species are flowed from the interior substrate processing region through the gas distribution showerhead.

Another embodiment of a method in accordance with the present invention for cleaning a substrate processing chamber comprises generating in a remote chamber reactive species suitable for cleaning unwanted material deposits in the processing chamber. During a first time period the reactive species are flowed, in order, from the remote plasma chamber through a gas distribution showerhead into the substrate processing chamber and then through an exhaust line. During a second time period the reactive species are flowed, in order, from the remote plasma chamber into the substrate processing chamber, through the gas distribution showerhead and then through an exhaust line.

Yet another embodiment of a method in accordance with the present invention of cleaning a processing chamber comprises generating a cleaning plasma containing a reactive ionic species. The generated cleaning plasma is flowed into the processing chamber through an inlet port different from a processing gas distribution showerhead utilized to flow a processing gas to a substrate within the chamber. The remotely generated plasma is exhausted from the processing chamber through the processing gas distribution showerhead.

Still another method in accordance with an embodiment of the present invention for cleaning a processing chamber comprises flowing a remotely generated cleaning plasma into the processing chamber through other than a gas distribution faceplate ordinarily utilized to flow processing gases into the chamber, such that the flowed plasma avoids a substantial pressure increase associated with flow through the gas distribution faceplate, thereby enhancing a concentration of reactive ionic species available to react with and clean the processing chamber.

An embodiment of a substrate processing system in accordance with the present invention comprises a housing defining a process chamber, a substrate support for supporting a substrate within the chamber, a processing gas source, and a remote plasma generator. A gas distribution showerhead is positioned proximate to the substrate support, and a foreline configured to receive exhaust from the chamber. A gas delivery system is in selective fluid communication with the processing gas source, the remote plasma source, the gas distribution showerhead, and the foreline. The gas delivery system is configurable to flow processing gas from the processing gas source into the chamber through the gas distribution showerhead during processing of a substrate within the chamber, and configurable to flow cleaning plasma from the chamber into the foreline through the gas distribution showerhead during removal of residue from the chamber.

An embodiment of a valve network in accordance with the present invention for governing flow of a remotely generated plasma to a processing chamber, the valve network comprising a first valve selectively operable to a first configuration to place a remote plasma source in fluid communication with the chamber. A second valve is selectively operable to a first configuration to place a gas distribution showerhead within the chamber in fluid communication with a chamber foreline.

A further understanding of embodiments in accordance with the present invention can be made by way of reference to the ensuing detailed description taken in conjunction with the accompanying drawings.

DESCRIPTION OF THE SPECIFIC EMBODIMENTS

A processing chamber is effectively cleaned by a remote plasma flowed through the chamber in roughly the opposite direction than is utilized during semiconductor processing. Specifically, the remotely generated plasma may be introduced through a processing gas exhaust port, and then exhausted from the chamber by traveling through the gas distribution shower head to the foreline. In accordance with one embodiment of the present invention, this reverse flow of remote cleaning plasma is maintained throughout the duration of the chamber cleaning step. In accordance with an alternative embodiment of the present invention, the direction of flow of the remote cleaning plasma through the chamber is alternated during the cleaning step between the reverse flow and a conventional forward flow.

Figure 1A:
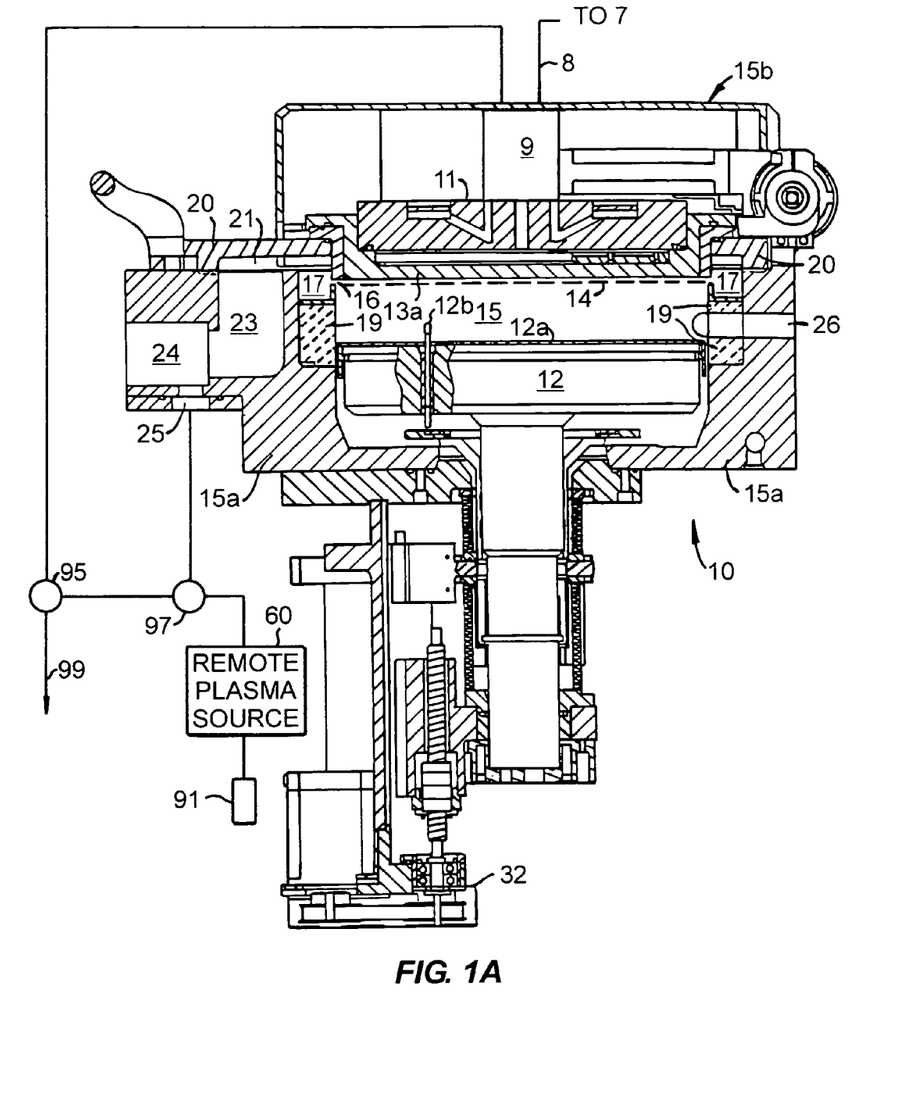
FIGS. 1A and 1B are vertical, cross-sectional views of one embodiment of a chemical vapor deposition apparatus according to the present invention.
Figure 1B:
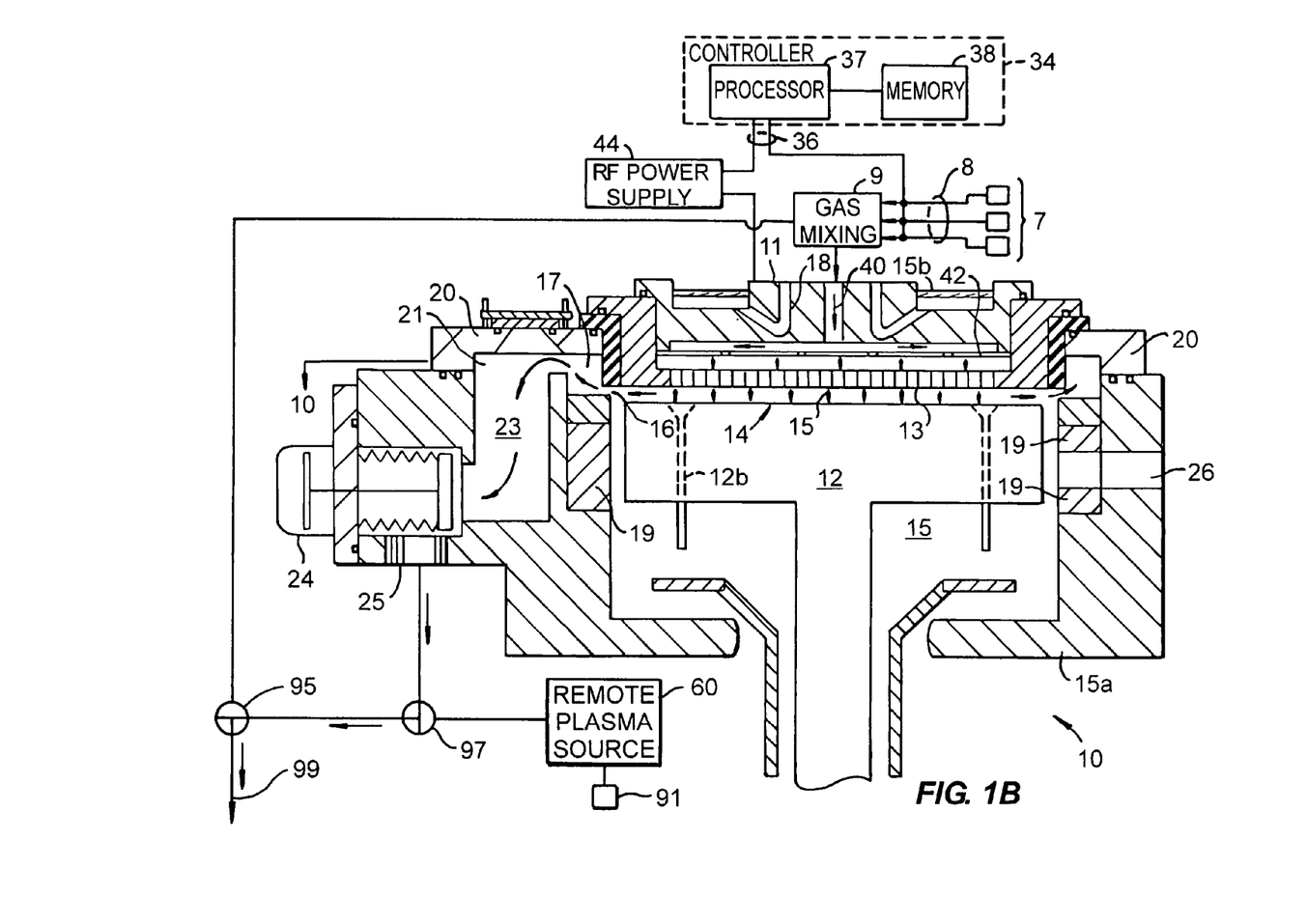
Figure 1C:
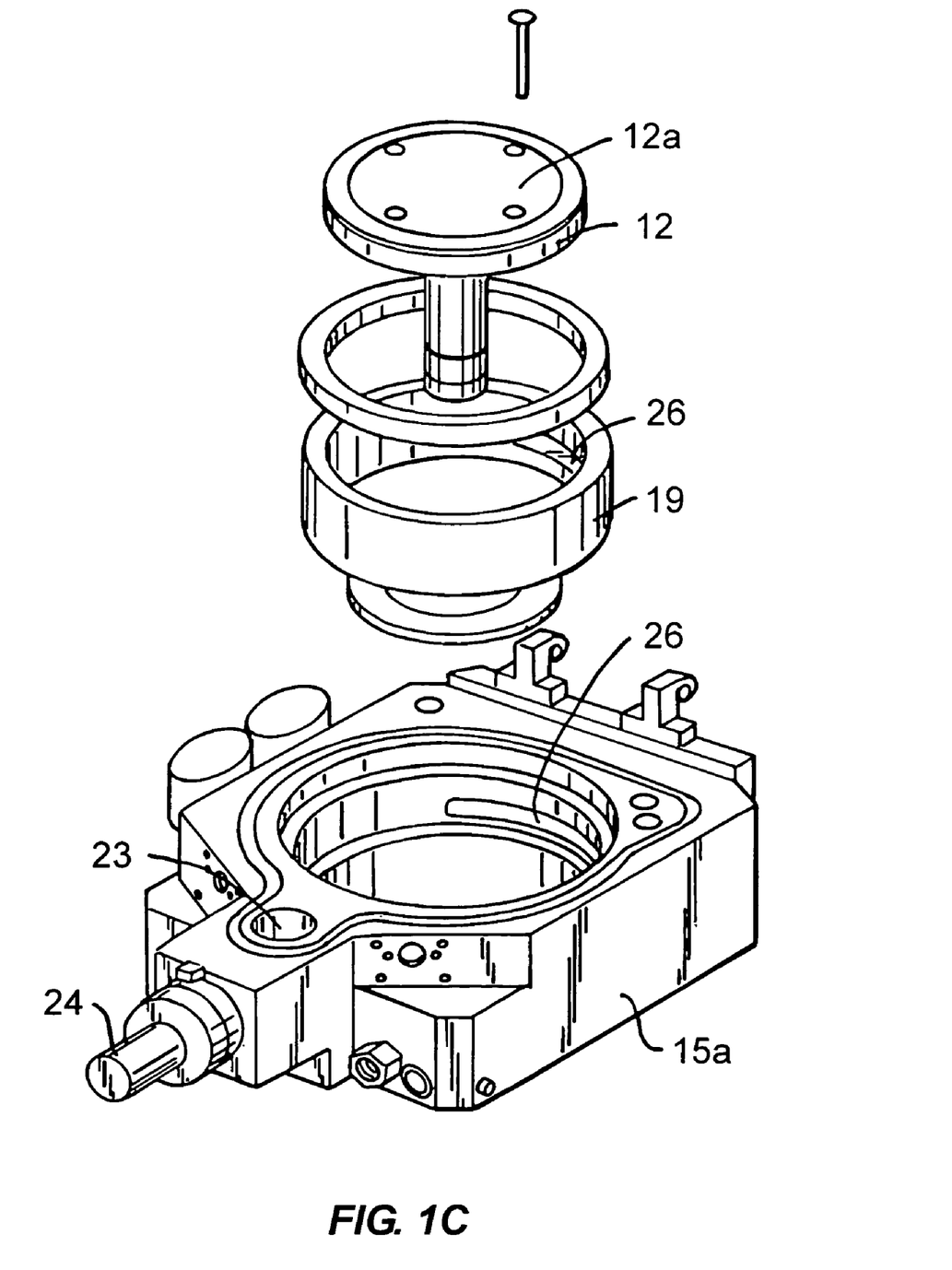
FIGS. 1C and 1D are exploded perspective views of parts of the CVD chamber depicted in FIG. 1A.
Figure 1D:
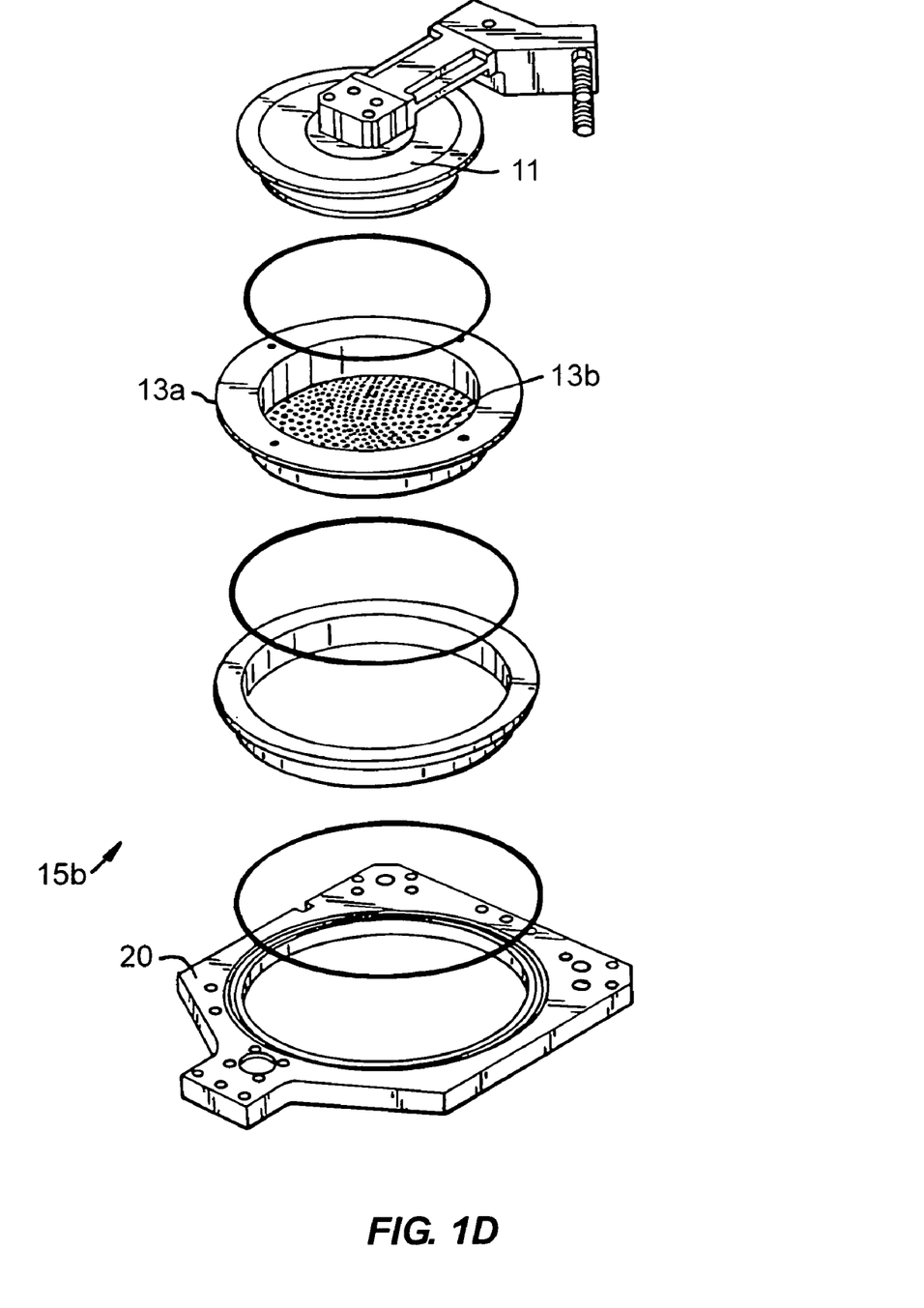

One suitable substrate processing system in which the method of the present invention can be carried out is shown in FIGS. 1A–B, which are vertical, cross-sectional views of a CVD system 10, having a vacuum or processing chamber 15 that includes a chamber wall 15a and a chamber lid assembly 15b. The chamber wall 15a and chamber lid assembly 15b are shown in exploded, perspective views in FIGS. 1C and 1D.

The CVD system 10 contains a gas distribution manifold 11 for dispersing process gases to a substrate (not shown) that rests on a heated pedestal 12 centered within the process chamber 15. During processing, the substrate (e.g. a semiconductor wafer) is positioned on a flat (or slightly convex) surface 12a of the pedestal 12. The pedestal 12 can be moved controllably between a lower loading/off-loading position (depicted in FIG. 1A) and an upper processing position (indicated by dashed line 14 in FIG. 1A and shown in FIG. 1B), which is closely adjacent to the manifold 11. A centerboard (not shown) includes sensors for providing information on the position of the wafers.

Processing gases are introduced into the chamber 15 through perforated holes 13b (FIG. 1D) of a conventional flat, circular gas distribution faceplate or showerhead 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a.

Before reaching the manifold 11, deposition and carrier gases are input from gas sources 7 through gas supply lines 8 (FIG. 1B) into a mixing system 9 where they are combined and then sent to manifold 11. As discussed in detail below, in accordance with certain embodiments of the present invention, mixing system 9 is also in selective fluid communication with chamber foreline 99 through valve 95.

Generally, the supply line 8 for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, an RF power supply 44 applies electrical power between the gas distribution faceplate 13a and the pedestal 12 so as to excite the process gas mixture to form a plasma within the cylindrical region between the faceplate 13a and the pedestal 12. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, the RF power supply 44 would not be utilized, and the process gas mixture thermally reacts to deposit the desired films on the surface of the semiconductor wafer supported on the pedestal 12, which is may be heated by lamps or by contact with the resistively-heated pedestal in order to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber 15 to maintain the chamber at an elevated temperature. A portion of these heat exchanging passages 18 in the lid assembly 15b of chamber 15 is shown in FIG. 1B. The passages in the remainder of the chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the processing gas exhaust port outlet 25 that connects through valves 95 to 97 foreline 99.

Remote plasma generator 60 is selectively in fluid communication with processing chamber through valve 97 and chamber processing gas exhaust outlet 25. The remote plasma generator 60 is desirably a compact, self-contained unit that can be conveniently mounted on the lid assembly 15b and be easily retrofitted onto existing chambers without costly and time-consuming modifications. One suitable unit is the ASTRON™ generator available from MKS Instruments, Inc. of Willmington, Mass. The ASTRON™ generator utilizes a low-field toroidal (LFT™) plasma to dissociate a process gas. In one example, the plasma dissociates a cleaning gas flowed into the remote plasma source 60 from a cleaning gas source 91. The cleaning gas may comprise a fluorine-containing gas including but not limited to $NF_3$ or $C_3F_8$, alone or in combination with a carrier gas such as argon to aid in generating free reactive fluorine ions which are used to clean residue and deposits in the process chamber 15.

FIG. 1B shows a simplified cross-sectional view of a deposition apparatus in accordance with the present invention, which is configured to flow gases for deposition on a substrate. Specifically, the processing gases flow from sources 7 through lines 8 into mixing structure 9. Valve 95 is closed, preventing any flow from the mixing structure to the foreline. Instead, gases mixed in structure 9 are flowed through gas box 11, orifices in blocker plate 42, and orifices in shower head 13, to the wafer being processed. Valves 95 and 97 are configured to allow processing gases to be exhausted from the chamber at port 25, and then flowed to foreline 99 for disposal.

In the configuration shown in FIG. 1B, the processing gas mixture flowed into the chamber is exposed to elevated pressures as it passes through the orifices present in both the blocker plate and in the gas distribution showerhead. During active processing of semiconductor wafers within the chamber, such elevated pressures are acceptable to achieve the necessary distribution of processing gases over the wafer resulting in uniform processing.

Figure 1E:
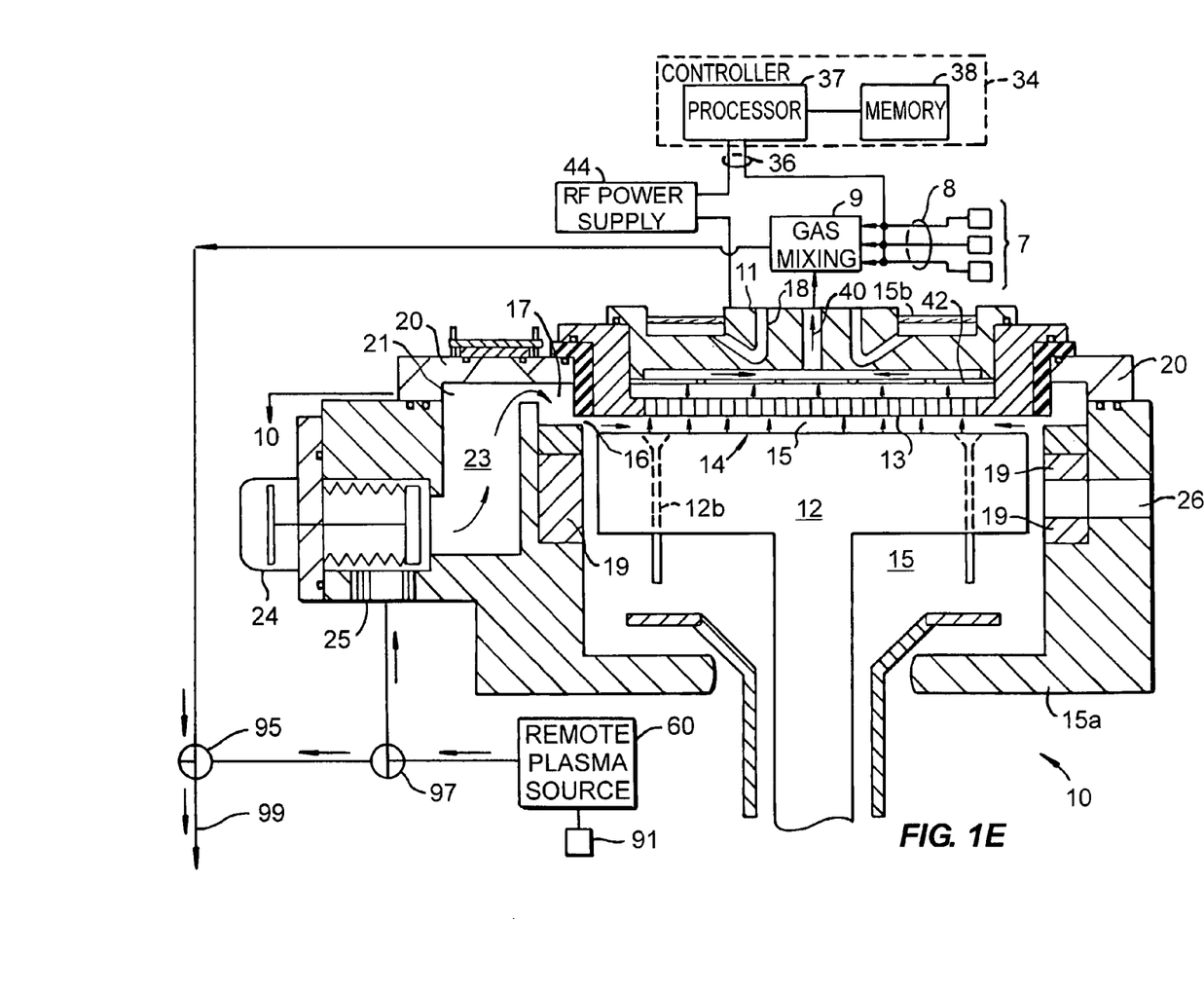
FIG. 1E shows a vertical, cross-sectional view of the embodiment of a chemical vapor deposition apparatus of FIG. 1A, where the flow of gases through the chamber is reversed for cleaning purposes.

FIG. 1E shows a simplified cross-sectional view of the deposition apparatus of FIGS. 1A–B, as configured for cleaning of the chamber. Specifically, a plasma containing reactive ionized species is generated in remote plasma source 60. Valve 97 is configured to flow this remotely generated plasma through processing gas exhaust port 25 into the chamber is, where the ionized species may react with and consume residue formed on exposed surfaces, such as on the bottom surface of gas distribution shower head 13a. The remotely generated plasma is then flowed through orifices 13b in the shower head 13a, through orifices in the blocker plate 42, and through manifold 11 into mixing structure 9. Valve 95 is configured to flow the remotely generated plasma to the foreline 99 for disposal.

In the configuration shown in FIG. 1E, initially the flowed cleaning plasma avoids a substantial increase in pressure as it enters the processing chamber. Reactive ions present in the flowed plasma thus experiences relatively little recombination, and a high concentration of ion species are thus available to react with and consume residue in the chamber, particular residue found on the exposed lower surface of the gas distribution face plate proximate to the substrate support. Only after having been flowed into the processing chamber and reacted with residue present therein, is the remotely generated plasma exposed to elevated pressures associated with passage through orifices of the gas distribution face plate. By this point in the cleaning process, however, desired reaction between the plasma and the residue would have already occurred, and some subsequent ionic recombination would not be expected to substantially affect cleaning.

Returning to FIGS. 1A–B, the wafer support platter of the pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. Wiring to the heater element passes through the pedestal stem.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 is assigned to Applied Materials, Inc., the assignee of the present invention, and is hereby incorporated by reference in its entirety. Other suitable CVD apparatus for utilizing embodiments in accordance with the present invention include the PRODUCER® tool also manufactured by Applied Materials.

A lift mechanism and motor 32 (FIG. 1A) raises and lowers the heater pedestal assembly 12 and its wafer lift pins 12b as wafers are transferred into and out of the body of the chamber 15 by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 1B) over control lines 36, of which only some are shown. Controller 34 relies on feedback from optical sensors to determine the position of movable mechanical assemblies such as the throttle valve and susceptor, which are moved by motors under the control of controller 34.

In the exemplary embodiment shown in FIG. 1B, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, the memory 38 is a hard disk drive, but the memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

A process for depositing a film on a substrate or a process for cleaning the chamber 15 can be implemented using a computer program product that is executed by the controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes code to perform tasks identified in the program.

Figure 2:
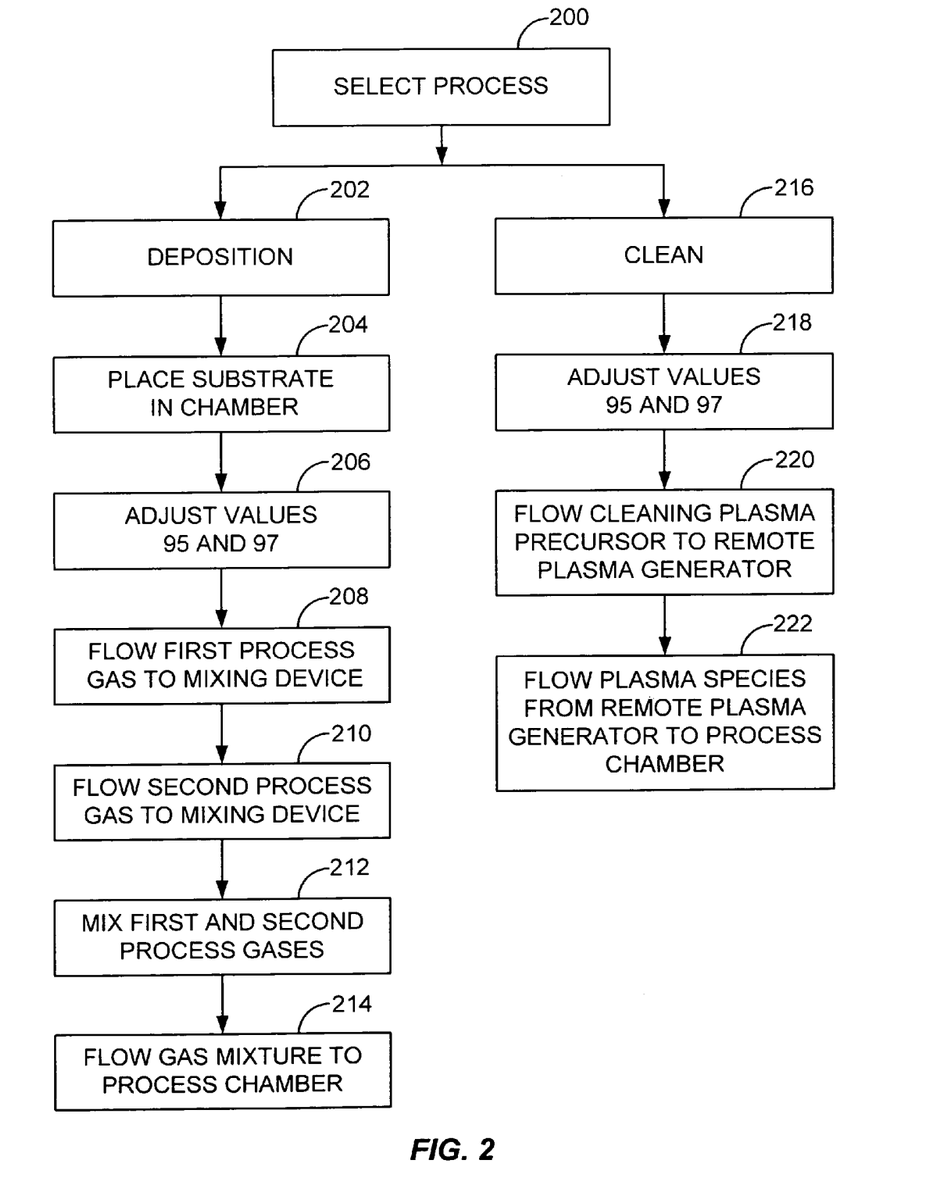
FIG. 2 is a simplified flow chart illustrating the processes according to an embodiment of the invention.

The simplified flow chart of FIG. 2 illustrates the use of the CVD system 10 of FIGS. 1A–E to carry out deposition and clean processes. At step 200 in the beginning of the process, a process mode is selected. In the deposition mode (step 202), a substrate is provided in the chamber 15 (step 204). Next, valves 95 and 97 are adjusted to permit the forward flow of process gases through the chamber. Specifically, valve 97 is adjusted to flow gas from the processing gas outlet 25 to valve 95, and valve 95 is adjusted to receive gas from valve 97 and to flow the gas to the foreline 99. A first process gas from source 7 is directed from the first inlet line 8 to the mixing device 9 (step 208). At step 210, a second process gas is flowed to the mixing device 9 from a second source 7 via a second inlet line 8 (FIG. 4). The mixing device 9 mixes the first and second process gases at step 212. The gas mixture is flowed into the chamber 15 to deposit a layer on the substrate (step 214). In one example, the first process gas includes ozone, and the second process gas includes TEOS.

In the clean mode (step 216) of FIG. 2, valves 95 and 97 are adjusted to permit the reverse flow of cleaning plasma through the chamber. Specifically, valve 97 is adjusted to flow the remotely generated plasma into the processing gas outlet of the chamber. The cleaning plasma exhausted through mixing structure 9 is then flowed by valve 95 to foreline 99 for disposal. A cleaning plasma precursor is flowed from generator 60 which dissociates the precursor to generate a cleaning plasma containing reactive ion species (step 220). The plasma species are flowed from the remote plasma generator 60 through valve 97 to clean the chamber 15 at step 222. In one example, the cleaning plasma precursor includes a fluorine-containing gas such as $NF_3$ and argon. The plasma in the generator 60 dissociates the $NF_3$ to generate reactive fluorine ions for cleaning residue within the process chamber 15.

In a specific embodiment, the pressure in the chamber 15 is about 2.5 torr, and the pressure in the remote plasma generator 60 is about 8 torr. System controller 34 can be used to control the pressure in the remote plasma generator 60 as well as the pressure in the chamber 15.

While the above is a description of specific embodiments in accordance with the present invention, various modifications, variations, and alternatives may be employed. For example, while the particular embodiment illustrated in FIGS. 1A–B and 1E features the flow of a remotely generated plasma into the chamber through the same port utilized to exhaust process gases, this is not required by the present invention. In accordance with alternative embodiments, the remotely generated cleaning plasma may we flowed into the chamber through one or more cleaning gas inlets specially formed to for the purpose of allowing the chamber to receive the flow of the remotely-generated plasma. The location, number, and size of such cleaning gas inlets may be custom tailored to enhance cleaning effects.

And while the embodiment shown and described above utilizes a network of two valves having "T"-shaped orifices to control the forward direction of flow of processing gases and the reverse flow of chamber cleaning gases, this is also not required by the present invention. In accordance with alternative embodiments, the direction of flow of the processing or cleaning gases can be governed by operation of a different number of valves than two, and/or by valves having a different type of orifice shape.

Moreover, while the embodiment shown and described in connection with the above figures utilizes a constant, reverse flow of cleaning gases, this is also not required by the present invention. In accordance with alternative embodiments, the direction of flow of cleaning gases into and through the processing chamber may change over time in order to accomplish optimal results. Changing the direction of flow of remote cleaning plasma is shown and discussed in connection with FIGS. 3A–B, which show vertical, cross-sectional views of an alternative embodiment of a chemical vapor deposition apparatus according to the present invention in which the direction of flow of a remotely generated cleaning plasma is attached.

Figure 3A:
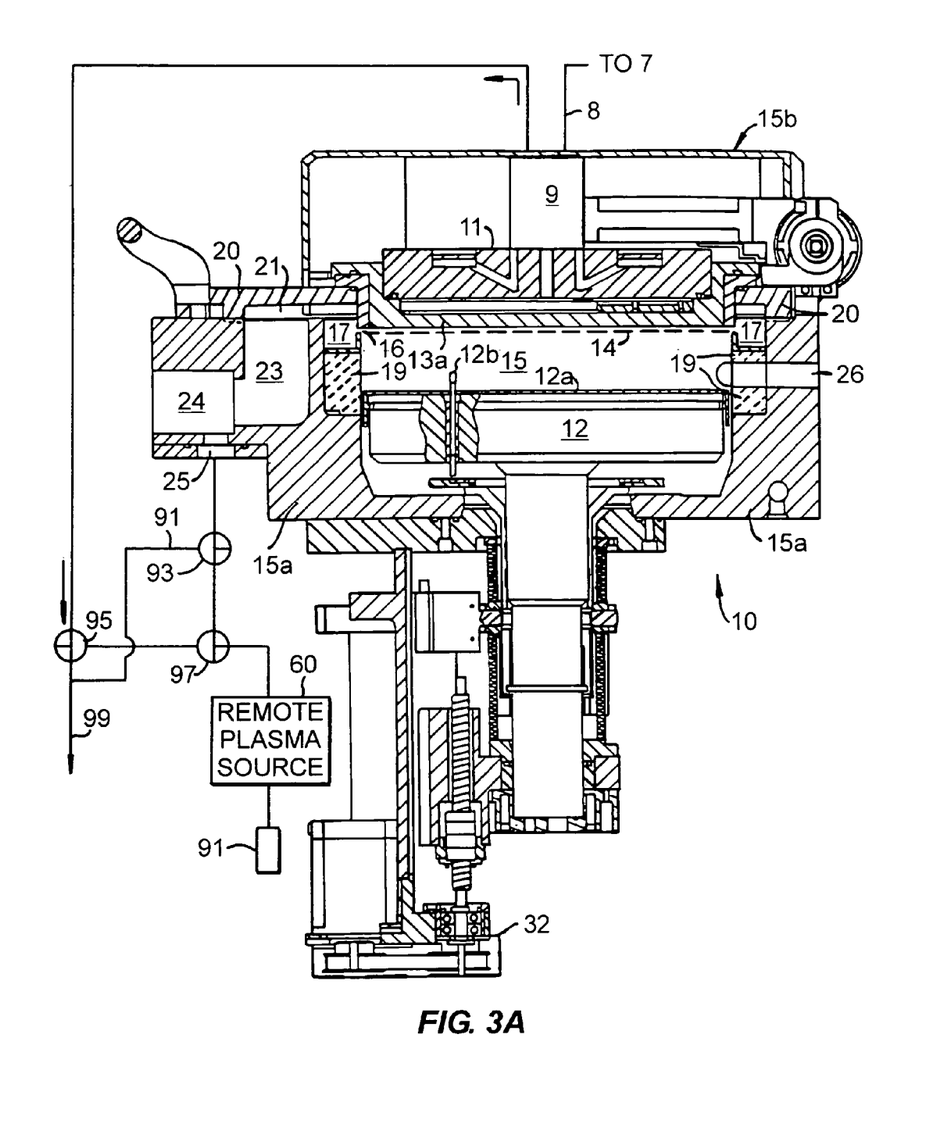
FIGS. 3A and 3B are vertical, cross-sectional views showing the direction of flow of a remotely generated cleaning plasma flowed through an alternative embodiment of a chemical vapor deposition apparatus according to the present invention.
Figure 3B:
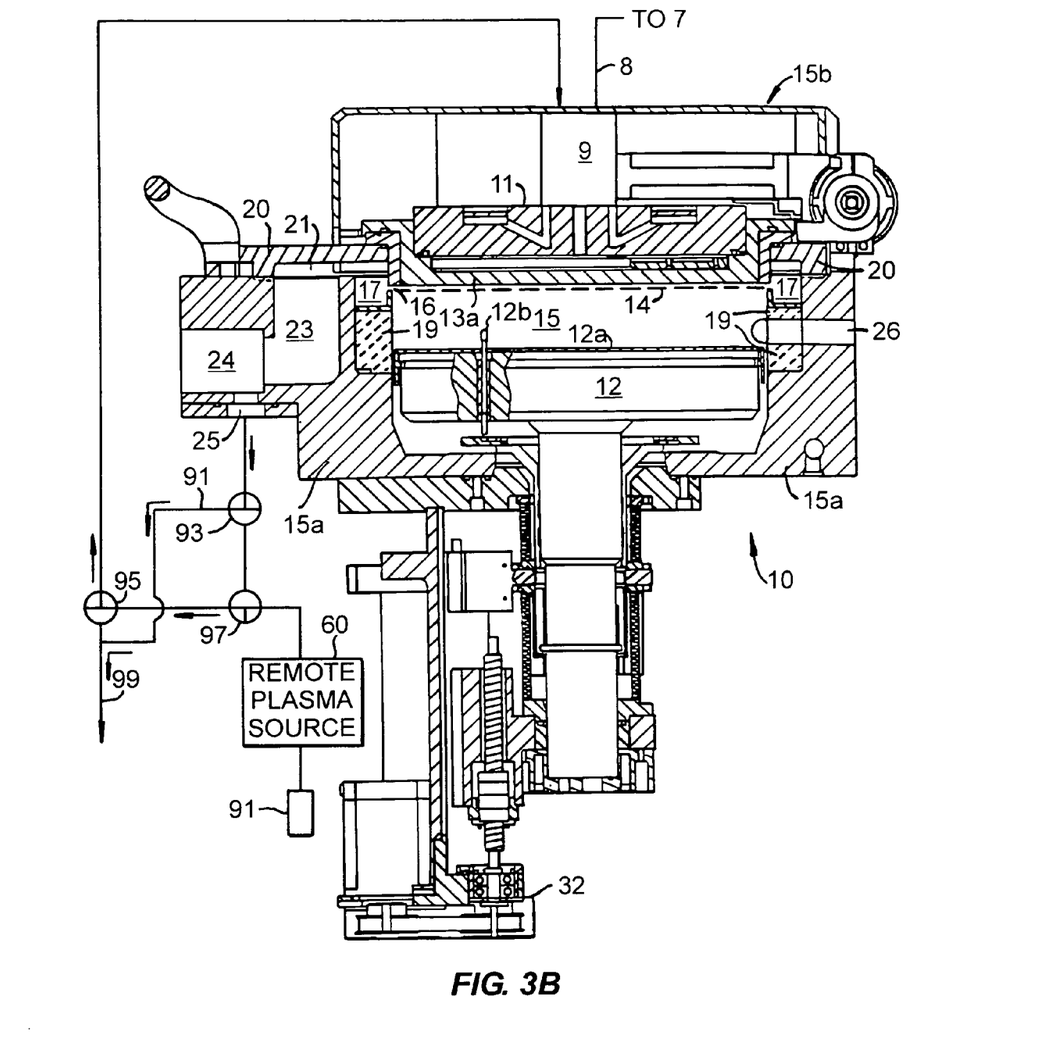

The CVD apparatus of FIGS. 3A–B is similar to that shown in FIGS. 1A–B, except that additional valve 93 is present. Valve 93 allows fluid communication with the foreline through a by-pass line 91, and is operable to selectively flow remotely generated cleaning plasma in either a forward or reverse direction through the processing chamber.

Specifically, FIG. 3A shows the reverse flow of cleaning plasma through the chamber, as was described above in connection with FIG. 1E. Cleaning plasma generated in remote source 60 is flowed successively through valves 97 and 93 before entering the chamber through processing gas exhaust port 25. The cleaning plasma is exhausted from the chamber through shower head 13a, blocker plate 42, manifold 11, and mixing structure 9, successively. From mixing structure 9, the cleaning plasma is flowed through valve 95 to foreline 99 for disposal.

The valve/line configuration of FIG. 3A allows the direction of flow of remotely generated plasma to be rapidly and easily changed to the forward direction. This is shown in FIG. 3B, wherein the position of valves 93, 95, and 97 is changed relative FIG. 3A, such that plasma remotely generated in source 60 flows through valve 97 to valve 95. From valve 95, the plasma flows into mixing structure 9 and then to the manifold 11, blocker plate 42, and shower head 13a in the forward direction associated with the flow of gases during normal processing. The cleaning plasma is in turn exhausted from the chamber through the processing gas exhaust port 25, then flows through valve 93 and by-pass line 91 to the foreline 99. In the alternative embodiment just described, the process gas control subroutine of FIG. 1F would operate to control the configuration of valves 93, 95, and 97, and to vary these valve configurations over time.

Figure 4:
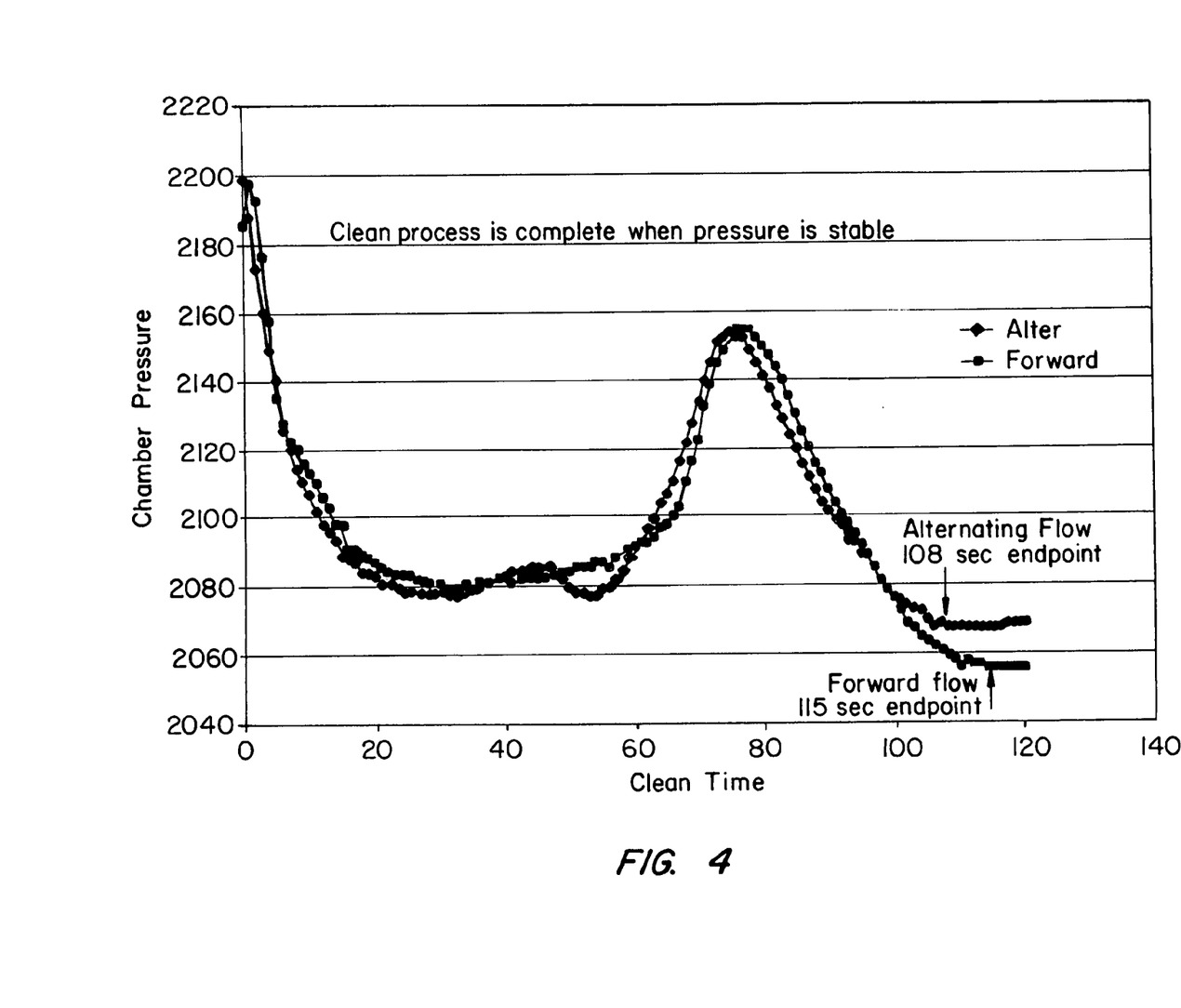
FIG. 4 plots chamber pressure versus cleaning time for cleaning processes employing an exclusively forward flow of cleaning gases, and employing an alternating flow of cleaning gases.

Utilizing an alternating flow of cleaning gases in accordance with an alternative embodiment of the present invention may result in more effective cleaning. For example, endpoint in the chamber cleaning process may be indicated when pressure within the chamber stabilizes. FIG. 4 plots chamber pressure versus cleaning time for cleaning processes employing an exclusively forward flow of cleaning gases, and employing an alternating flow of cleaning gases. FIG. 4 shows that alternating the direction of flow of the cleaning gases resulted in a clean chamber after about 108 seconds, as compared with a cleaning endpoint of 115 seconds when the cleaning gas was flowed only in the forward direction.

Variations other than those specifically described above will be apparent to persons of skill in the art. These equivalents and alternatives are included within the scope of the present invention. Therefore, the scope of this invention is not limited to the embodiments described, but is defined by the following claims and their full scope of equivalents.

What is claimed is:

1. A substrate processing system comprising:
   a housing defining a process chamber;
   a substrate support for supporting a substrate within the chamber;
   a processing gas source;
   a remote plasma generator;
   a gas distribution showerhead positioned proximate to the substrate support,
   a foreline configured to receive exhaust from the chamber; and
   a gas delivery system in selective fluid communication with the processing gas source, the remote plasma source, the gas distribution showerhead, and the foreline, the gas delivery system configurable to flow processing gas from the processing gas source into the chamber through the gas distribution showerhead during processing of a substrate within the chamber, and configurable to flow cleaning plasma from the chamber into the foreline through the gas distribution showerhead during removal of residue from the chamber,
   wherein the gas delivery system comprises:
   a first valve selectively operable to a first configuration to place the remote plasma source in fluid communication with the chamber; and
   a second valve selectively operable to a first configuration to place the gas distribution showerhead in fluid communication with the foreline,
   wherein the first valve is selectively operable between the first configuration and a second configuration to place the chamber in fluid communication with the second valve; and
   the second valve is selectively operable between the first configuration and a second configuration to place the first valve in fluid communication with the foreline.

2. The substrate processing system of claim 1 wherein the first valve is in selective fluid communication with the chamber through a port utilized to exhaust process gases from the chamber during processing of a semiconductor substrate within the chamber.

3. The substrate processing system of claim 1 wherein the first valve is in selective fluid communication with the chamber through a cleaning gas inlet port distinct from a processing gas exhaust port.

4. The substrate processing system of claim 1 further comprising a third valve selectively operable between a first configuration to place the first valve in fluid communication with the chamber, and a second configuration to place the chamber in fluid communication with the foreline through a bypass line.

5. The substrate processing system of claim 4 wherein the third valve comprises a three-way valve having a "T"-shaped orifice.

6. The substrate processing system of claim 4 further comprising a controller in communication with the first, second, and third valves, the controller operable to configure the first, second, and third valves in the first configuration during a chamber cleaning process, and to configure the first, second, and third valves in the second configuration during processing of a substrate within the chamber.

7. The substrate processing system of claim 4 wherein the third valve is in selective fluid communication with the chamber through a port utilized to exhaust process gases from the chamber during processing of a semiconductor substrate within the chamber.

8. The substrate processing system of claim 4 wherein the third valve, is in selective fluid communication with the chamber through a cleaning gas inlet port distinct from a processing gas exhaust port.

9. A valve network governing flow of a remotely generated plasma to a processing chamber, the valve network comprising:

a first valve selectively operable to a first configuration to place a remote plasma source in fluid communication with the chamber; and a second valve selectively operable to a first configuration to place a gas distribution showerhead within the chamber in fluid communication with a chamber foreline, wherein the first valve is selectively operable between the first configuration and a second configuration to place the chamber in fluid communication with the second valve; and the second valve is selectively operable between the first configuration and a second configuration to place the first valve in fluid communication with the foreline.

10. The valve network of claim 9 further comprising a third valve selectively operable between a first configuration to place the first valve in fluid communication with the chamber, and a second configuration to place the chamber in fluid communication with the chamber foreline through a bypass line.

11. The valve network of claim 10 wherein the third valve comprises a three-way valve having a "T"-shaped orifice.

12. The valve network of claim 10 further comprising a controller in communication with the first, second, and third valves, the controller operable to configure the first, second, and third valves in the first configuration during a chamber cleaning process, and to configure the first, second, and third valves in the second configuration during processing of a substrate within the chamber.

* * * * *